United States Patent [19]
Andoh

[11] Patent Number: 5,617,428
[45] Date of Patent: Apr. 1, 1997

[54] SCAN TEST CIRCUIT AND SEMICONDUCTOR INTEGRATED CIRCUIT DEVICE WITH SCAN TEST CIRCUIT

[75] Inventor: Yasuhiro Andoh, Tokyo, Japan

[73] Assignee: NEC Corporation, Japan

[21] Appl. No.: 650,655

[22] Filed: May 20, 1996

[30] Foreign Application Priority Data

May 24, 1995 [JP] Japan .................. 7-124893

[51] Int. Cl.$^6$ .................................. G01R 31/28
[52] U.S. Cl. ......................................... 371/22.3
[58] Field of Search ..................... 371/22.3, 22.1, 371/22.8, 22.6, 25.1, 27; 395/183.06

[56] References Cited

U.S. PATENT DOCUMENTS 5,574,733 11/1996 Kim ............................. 371/22.3
5,577,052 11/1996 Morris ......................... 371/22.3

FOREIGN PATENT DOCUMENTS 3-218483 9/1991 Japan ................ G01R 31/28

*Primary Examiner*—Vincent P. Canney
*Attorney, Agent, or Firm*—Hayes, Soloway, Hennessey, Grossman, & Hage, P.C.

[57] ABSTRACT

The scan test circuit disclosed has a first input terminal and a second input terminal for respectively inputting first data of one bit and second data as serial data, a third input terminal for inputting an operation switching signal for determining a scan operation and a normal operation, an input selector for selecting either the first data or the second data in response to the supply of the operation switching signal and outputting the selected data, a register for holding the selected data as hold data, a first output terminal for outputting first output data, and a second output terminal for outputting second output data. The scan test circuit includes a latch circuit which latches a shift mode signal and generates an operation switching latch signal. A selector selectively outputs either an input data or an input data as a selected signal in response to the supply of the signals. Block tests can be executed with an interval corresponding to two clock pulses immediately after the switching of operations from the scan test operation.

7 Claims, 10 Drawing Sheets

SCAN TEST CIRCUIT AND SEMICONDUCTOR INTEGRATED CIRCUIT DEVICE WITH SCAN TEST CIRCUIT

BACKGROUND OF THE INVENTION

1. Field of the Invention

The present invention relates to scan test circuits and semiconductor integrated circuit devices including the same, and more particularly to scan test circuits which comprise shift registers and with which scan testing of logic operation of circuits is performed by scanning, and semiconductor integrated circuit devices including the same.

2. Description of the Related Art

With recent LSI integration density advancement, logic operation tests are being increasingly performed by using scan test circuits which are formed in LSIs for realizing efficient functional tests. In a scan test method using such a scan test circuit, a plurality of registers having a shift register function are connected to a single shift register bus. In test operation, a test pattern data is inputted serially from the outside of the chip, and predetermined data are set in the individual registers. Logic circuits are connected to data output terminals of these registers, and desired logic signals are supplied to these logic circuits. The logic circuits are operated according to the logic signals, and results of operation are provided as parallel data to the registers from parallel input terminals thereof. Data which have thus been set in the registers are subsequently outputted serially to the outside of the chip. Observation of the output data permits improving the observability and controllability of the circuit operation of large-scale logic circuit network.

On the other hand, the recent increase in the speed of LSI operation has made design of timing margins even shorter, and deviations from design values and variations of delay characteristics, such as through rate, which were not so significant have become important factors for design of LSIs. However, improvements in scan test circuits have heretofore been focussed on the suppression of the increase in the number of test patterns and test time due to an increase in scan bits that accompanies increased LSI integration density.

Shown in the circuit diagram of FIG. 1 is a usual scan test circuit comprising a shift register. This prior art scan test circuit comprises a flip-flop 1, which constitutes a shift register for receiving an input signal $S_{fi}$, a clock $S_{ck}$ and an inverted clock $S_{ck}$-bar ("-bar" represents an inversion throughout the description) and outputting output signals $S_{so}$ and $S_{do}$ from output terminals SO and DO; a selector 5 for outputting the input $S_{fi}$ to the flip-flop 1 through switching a data signal $S_{di}$ and a serial signal $S_{si}$ in response to a shift mode signal $S_{sm}$ and an inverted shift mode signal $S_{sm}$-bar supplied through a terminal SM; an inverter I2 for inverting the shift mode signal $S_{sm}$ to generate the inverted shift mode signal $S_{sm}$-bar, and an inverter I3 for inverting the clock $S_{ck}$ to generate the inverted clock $S_{ck}$-bar.

The flip-flop 1 includes latches 11 and 12 connected in series for providing signals $S_{fi}$ and $S_{fo}$, respectively, and inverters I15 and I16.

The latch 11 includes inverters I11, I12 and I17 and CMOS transfer gates T11 and T12. The clock $S_{ck}$ is supplied to an N-channel gate of the transfer gate T11 and also to a P-channel gate of the transfer gate T12, and the inverted clock $S_{ck}$-bar is supplied to a P-channel gate of the transfer gate T11 and an N-channel gate of the transfer gate T12. The signal $S_{fi}$ is inputted to the input terminal of the inverter I17, which has its output terminal connected to the input terminal of the transfer gate T12. The output terminal of the transfer gate T12, i.e., the output terminal of the latch 11, is connected to the input terminal of the inverter I12, the output terminal of the transfer gate T11 and the input terminal of the latch 12, i.e., the input terminal of the transfer gate T14. The output terminal of the inverter I12 is connected to the input terminal of the inverter I11, which has its output terminal connected to the input terminal of the transfer gate T11.

The latch 12 includes inverters I13 and I14 and CMOS transfer gates T13 and T14. The clock $S_{ck}$ is supplied to an N-channel gate of the transfer gate T14 and a P-channel gate of the transfer gate T13, and the inverted clock $S_{ck}$-bar is supplied to a P-channel gate of the transfer gate T14 and an N-channel gate of the transfer gate T13. The transfer gate T14 has its input terminal connected to the output terminal of the transfer gate T12, i.e., the output terminal of the latch 11, and its output terminal connected to the input terminals of the inverters I14 to I16 and the output terminal of the transfer gate T13. The output terminal of the inverter I14 is connected to the input terminal of the inverter I13. The output terminal of the inverter I13 is connected to the input terminal of the transfer gate T13. The signals $S_{so}$ and $S_{do}$ are outputted from the output terminals of the inverters I15 and I16 to the output terminals SO and DO.

The selector 5 includes CMOS transfer gates T51 and T52, which are controlled by the shift mode signal $S_{sm}$ and its inverted shift mode signal $S_{sm}$-bar to receive the input data signal $S_{di}$ and serial signal $S_{si}$, respectively, and have their output terminals connected together to output the signal $S_{fi}$.

The shift mode signal $S_{sm}$ is supplied to a P-channel gate of the transfer gate T51 and an N-channel gate of the transfer gate T52, and the inverted shift mode signal $S_{sm}$-bar is connected to an N-channel gate of the transfer gate T51 and a P-channel gate of the transfer gate T52.

The operation of the prior art scan test circuit having the above construction, will now be described with reference to FIG. 1. When the shift mode signal $S_{sm}$ is at "L" level, the transfer gate T51 is "on" while the transfer gate T52 is "off". The selector 5 thus selectively outputs input data signal $S_{di}$ as the output signal $S_{fi}$ to the flip-flop 1. When the shift mode signal $S_{sm}$ is at "H" level, on the other hand, the transfer gate T51 is "off" while the transfer gate T52 is "on". The selector 5 thus selectively outputs the serial signal $S_{si}$ as the output signal $S_{fi}$ supplied to the flip-flop 1.

In the flip-flop 1, when the clock $S_{ck}$ is at "L" level, the transfer gates T12 and T13 in the latches 11 and 12 are "on", while the transfer gates T11 and T14 are "off". Thus, the signal $S_{fi}$ from the selector 5 is inputted to the latch 11, so that the latch 12 is held in a state of holding data, i.e., the output of the flip-flop 1 is held. When the clock $S_{ck}$ is at "H" level, the transfer gates T12 and T13 in the latches 11 and 12 are "off", and the transfer gates T11 and T14 are "on". Thus, the latch 11 is held in a state of holding data, and the latch 12 outputs data $S_{fi}$ in the latch 11. The inversion of the clock $S_{ck}$ from "L" level to "H" level, changes the output of the flip-flop 1.

Shown in the block diagram of FIG. 2 is a prior art semiconductor integrated circuit device chip (hereinafter referred to as "chip") using scan test circuits shown in FIG. 1 as shift registers. The illustrated chip comprises two under-test circuit blocks CB1 and CB2 and six scan test circuits SR1 to SR6.

The scan test circulars SR1 and SR2 have output terminals DO connected to input terminals J1 and J2 of the circuit block CB1, which has output terminals 01 and 02 connected to input terminals D1 of scan test circuits SR3 and SR4. The scan test circuits SR3 and SR4 have their output terminals connected to input terminals J1 and J2 of the circuit block CB2, which has output terminals 01 and 02 connected to input terminals D1 of the scan test circuits SR5 and SR6.

The scan test circuits SR1 to SR6 are connected between a serial data input terminal SIN and an output terminal SOT of the chip via their input and output terminals SI and SO, thus constituting a scan path. Their clock input terminals CK are connected to a clock input terminal CKT of the chip to supply the clock $S_{ck}$ to them, and their input terminals SM are connected to a shift mode input terminal SFT of the chip to supply the shift mode signal $S_{sm}$ to them.

The operation of the chip will now be described. For normal operation, the shift mode signal $S_{sm}$ is set to "L" level. The scan test circuits SR1 to SR6 are thus each operated as a flip-flop as described above. Specifically, in each of the scan test circuits the selector 5 selectively provides the data signal $S_{di}$ to be taken out in response to the supply of the clock $S_{ck}$, and the output signal $S_{do}$ is provided from the output terminal DO.

The test operation includes a scan operation and a block test operation. The scan operation includes a scan-in operation and a scan-out operation. The scan-in and scan-out operations can be executed simultaneously.

In the scan operation, the shift mode signal $S_{sm}$ is set to "H" level. Each of the scan test circuits SR1 to SR6 thus operates as a flip-flop with the serial signal $S_{si}$ selected as input, taking the serial signal $S_{si}$ at the input terminal SI in response to the supply of the clock $S_{ck}$ and outputting the output signal $S_{so}$ from the output terminal SO, that is, an operation of providing test data of the circuit blocks CB1 to CB2 from the serial data input terminal SIN of the chip to the scan test circuits is executed. A scan-out operation is also executed to take out output data o1 and o2 of the circuit blocks CB1 and CB2 that have been taken out in the scan test circuits SR4 to SR6 from the serial data output terminal SOT of the chip.

In the block test Operation, as in the normal operation the shift mode signal $S_{sm}$ is set to "L" level. At this time, in the scan test circuits SR1 to SR4, test data of the circuit blocks CB1 and CB2 are taken-in in advance by the scan-in operation and these data are inputted respectively to the input terminals J1 and J2. Subsequently, the scan test circuits SR3 to SR6 take in the test results in the circuit blocks CB1 and CB2 in response to the supply of a pulse of the clock $S_{ck}$. Desired test results thus can be taken out through subsequent scan-out operation. The scan operation and block test operation are alternately executed repeatedly for every one of all desired test patterns. In this way, the test of the circuit blocks CB1 and CB2 is executed. In the scan data circuit as described above, while the test data $S_{si}$ that has been taken-in in the scan test circuit in the scan operation is immediately outputted from the output terminal DO, on the input side it is highly possible that the test results of circuit block are given to the terminal DI before selection of the signal $S_{di}$ as an input signal Of normal operation due to such condition as the distribution of the shift mode signal $S_{sm}$.

Shown in the block diagram of FIG. 3 is a different prior art scan test circuit, which is disclosed in Japanese Patent Application Kokai Publication No. Hei 3-218483. The illustrated scan test circuit is different from the previously described prior art scan test circuit in that a data signal $S_{d1}$ and a serial signal $S_{s1}$ are used in lieu of the data signal $S_{di}$ and serial signal $S_{si}$, clocks $S_{td}$, $S_{t2}$, $S_{t3}$ and $S_{t1}$ respectively for taking out data, holding data, outputting data and test control are used in lieu of the data/test common clock $S_{ck}$, and a set signal $S_{tss}$ and a reset signal $S_{rss}$ are used in lieu of the shift mode signal $S_{sm}$, and that the formats of these control signals are met by using, in lieu of the two latch circuits each comprising the flip-flop 1 and the selector 5, four latch circuits 6 to 9, four inverters I101 to I104 and a NOR gate G101 for NORing the signals $S_{tss}$ and $S_{ls}$ to provide an output signal $S_{nr}$.

The inverters I102 and I101 invert input signals $S_{d1}$ and $S_{s1}$ from terminals D1 and S1 to generate inverted input signals $S_{d1}$-bar and $S_{s1}$ to be supplied to the latch 6. The inverters I103 and I104 invert the outputs $S_{do}$-bar and $S_{so}$-bar of the latches 8 and 7 to generate the output signals $S_{do}$ and $S_{so}$.

The latch 6 includes inverters I61 and I62 and transfer gates T61 to T64 comprising N-channel MOS transistors.

The inverters I61 and I62 constitute a register with their input and output terminals connected ring-like. The output terminal of the inverter I102 is connected to a series connection of the transfer gates T62 and T61, and the output terminal of the transfer gate T61 is connected to the input terminal of the inverter I61.

The clock $S_{td}$ is supplied from an input terminal TD to the gate of the transfer gate T61, and the output signal $S_{ls}$ of the latch 9 is supplied to the gate of the transfer T62. The transfer gates T63 and T64 are connected in parallel at their input and output terminals, and their output terminals are connected to the input terminal of the inverter I61. The clock $S_{t1}$ from the terminal T1 is connected to the gate of the transfer gate T63, and the output signal $S_{nr}$ of the NOR gate G101 is supplied to the gate of the transfer gate T64. The output $S_{lo}$ of the latch 6 is supplied to the latches 7 to 9.

The latch 7 includes inverters I71 and I72 which, as in the inverters I61 and I62, constitute a register with the input and output terminals connected ring-like, and transfer gates T71 and T72, which are connected in parallel at their input and output terminals, have their input terminals connected to the output terminal of the latch 6 and have their output terminals connected to the input terminal of the inverter I71.

The clock $S_{t2}$ from a terminal T2 is supplied to the gate of the transfer gate T71, and the signal $S_{nr}$ is supplied to the gate of the transfer gate T72. An inverter I104 inverts the inverted output signal $S_{so}$-bar of the latch 7 to the signal $S_{so}$ to be outputted to an output terminal SO.

The latch 8 includes inverters I81 and I82 which, as in the inverters I61 and I62, constitute a register with their input and output terminals connected ring-like, and transfer gates T81 and T82 connected in series.

The clock $S_{t3}$ from a terminal T3 is supplied to the gate transfer gate T81, and the signal $S_{ls}$ is supplied to the gate of the transfer gate T82. An inverter I103 inverts the inverted output $S_{do}$-bar of the latch 7 to the signal $S_{do}$ to be supplied to an output terminal DO.

The latch 9 includes inverters I91 and I92 which, as in the inverters I61 and I62, constitute a register with their input and output terminals connected ring-like, a transfer gate T91 for receiving the clock $S_{tss}$ at the gate and the input signal $S_{lo}$ at the input terminal and having the output terminal connected to the input terminal of the inverter I91, and a pull-down circuit PD1 for receiving the reset signal $S_{rss}$ at the gate and connected to the output terminal of the transfer gate T91. The inverter T91 supplies the output signal $S_{ls}$ to the NOR gate G101.

In this second scan test circuit, the latches 6 to 8 are operated as scan latch like the flip-flop 1 in the previous prior art scan test circuit, and the latch 9 is operated as a selector latch for selecting scan test circuit.

Shown in the block diagram of FIG. 4 is a different or second semiconductor integrated circuit device chip (hereinafter referred to as chip), which uses the different or second prior art scan test circuits SRL1 to SRL6 as shift registers. The operation of the second prior art scan test circuit will now be described. This chip has a clock terminal TTS and a reset terminal TRS for supplying a clock $S_{tss}$ and a reset signal $S_{rss}$ to a clock input terminal TSS and a reset terminal RSS of the scan test circuits SRL1 to SRL6. An input terminal T3 of the scan test circuit SRL1 is connected to a clock input terminal T3a of the chip, and terminals T3 of the scan test circuits SRL2 to SRL4 are connected to a clock input terminal T3b. Terminals TD of the scan test circuits SRL3 to SRL6 are connected to a terminal TD of the chip.

In normal operation, the clocks $S_{t1}$, $S_{t2}$ and $S_{tss}$ are set to "L" level, and the signals $S_{t3}$, $S_{td}$ and $S_{rss}$ are set to "H" level. In response to the "H" level of the reset signal $S_{rss}$, the pull-down circuit PD91 in the latch 9 is turned on to reset the latch 9. As a result, the output signal $S_{ls}$ of the inverter I91 is inverted to "H" level, thus turning on the transfer gates T62 and T82 so that the output signal $S_{nr}$ of the NOR gate G101 is inverted to "L" level to turn off the transfer gates T64 and T72. In response to the "H" level of the signals $S_{t3}$ and $S_{td}$, the transfer gates T61 and T81 are turned on to bring the latches 6 and 8 to a data through state, i.e., bring the terminals D1 to D0 to a data through state. In the meantime, in response to the "L" level of the signals $S_{t1}$ and $S_{t2}$, the transfer gates T63 and T71 are turned off to bring the latch 7 to a hold state. The input of the serial signal $S_{s1}$ is thus suppressed.

In test operation, a scan test circuit selecting operation to select only the under-test circuit block is executed in addition to scan operation and block test operation like those in the previously described scan test circuit. At the time of the test, only a scan test circuit corresponding to a desired circuit block under test is made effective by the scan test circuit selecting operation, while setting the other scan test circuits to the data through state. Subsequently, the scan operation and block test operation like those in the previously described scan test circuit are executed.

In the scan test circuit selecting operation, a non-selection signal is provided when the output signal $S_{ls}$ of the latch 9 is at "L" level, and a selection signal is provided when the output is at "H" level. The latch 9 latches the output signal $S_{1o}$ of the latch 6, and the "H" and "L" levels of the signal $S_{s1}$ which is shiftedly inputted as a shift register selection signal, are a non-selection signal and a selection signal, respectively.

When testing the circuit block CB1, the pattern of the chip input serial signal $S_{sin}$ corresponding to the selection signal $S_{sl}$ is set to "H,H,L,L,L,L" to make the scan test circuits SRL1 to SRL4 effective and make the scan test circuits SRL5 and SRL6 to be in a data through state. The signal $S_{sin}$ is scanned-in under control of the clocks $S_{t1}$ and $S_{t2}$, and is latched in the latch 9 under control of the clock $S_{tss}$.

When testing the circuit block CB2, the pattern of the signal $S_{sin}$ is set to "L,L,L,L,H,H" to make the scan test circuits SRL3 to SRL6 effective and make the scan test circuits SRL1 and SRL2 to be in a data through state.

The required length of the test pattern of a circuit block and the number and the required number of scan clock pulses to be set in the selected scan test circuit, correspond to the number of shift registers that are made effective in the scan test circuit selecting operation. For example, in the test of the circuit block CB1, four scan test circuits SRL1 to SRL4 are required, so that the required scan pattern length is 4 bits and the required scan clock pulse number is 4. In scan operation, this test input pattern is supplied to the input terminal SIN in synchronization with the scan clocks $S_{t1}$ and $S_{t2}$, and the test result that is outputted from the output terminal SOT is compared with a reference test output pattern.

Block test operation will now be described. When testing the circuit block CB1, the test input pattern of the circuit block CB1 is preliminarily taken-in into the test scan circuits SRL1 and SRL2 in scan operation, and provided to the output terminals DO thereof and the input terminals I1 and I2 of the circuit block CB1 under control of the clock $S_{t3}$. Then, the test result is taken in the scan test circuits SRL3 and SRL4 under control of the clock $S_{td}$. Subsequently, the desired result can be taken out by a scan-out operation.

In this second prior art scan test circuit, only the scan test circuits corresponding to the under-test circuit block are operated to bypass the scan test circuits for the other circuit blocks. Thus, the stages of the scan pass of the test execution can be reduced in effect, thus permitting test time reduction.

Again with this second prior art scan test circuit, it is difficult to make the mutual phase differences of the scan clock $S_{t1}$, data take-in clock $S_{td}$ and data output clock $S_{t3}$ to be the same in the individual scan test circuits. Therefore, what is measured is not the delay in the critical path but the delay in the path, in which the phase difference between the data output signal $S_{t3}$ to the output side test circuit and the data take-in clock $S_{td}$ to the input side test circuit is smaller.

In the above scan test circuits and semiconductor integrated circuit devices described above, no consideration is given to the delay or skew of operation switching signal for switching the normal operation and test operation. In addition, the supply of clock in normal operation requires time redundancy in order to guarantee the completion of the switching from the test operation state over to the normal operation state. Therefore, the operation switching signal constitutes a critical path in the circuit operation time to make the test cycle time very slow. Particularly, in the large scale LSI it is impossible to measure the delay in the circuit under test and also to test in the actual operation cycles.

SUMMARY OF THE INVENTION

An object of the invention, therefore, is to overcome the problems existing in the prior art and to provide a scan test circuit with which a real time cycle test and delay measurement can be performed easily and reliably.

According to one aspect of the invention, there is provided, in a scan test circuit having a first input terminal for inputting first data of one bit, a second input terminal for inputting second data as serial data including predetermined scan test data, a third input terminal for inputting an operation switching signal for determining a scan operation and a normal operation, an input selector means for selecting one of the first data and the second data in response to the supply of the operation switching signal and outputting selected data, a register means for holding the selected data as hold data, a first output terminal for outputting first output data corresponding to the first data, and a second output terminal for outputting second output data corresponding to the second data, the scan test circuit being operable to carry out scanning operation such that, during normal operation, a plurality of under-test circuits are caused to be operated independently with one another and, during test operation, the plurality of under-test circuits are connected in series and the second data are supplied to a first-stage under-test circuit of the plurality of under-test circuits, and test results corresponding to the second data are outputted from a last-stage under-test circuit of the plurality of under-test circuits, the improvement comprises:

- a latch means which latches the operation switching signal and generates an operation switching latch signal; and
- a selector control means which is provided in the input selector means and which selects one of the first data and the second data in response to the supply of the operation switching signal and the operation switching latch signal and outputs the selected data.

The scan test circuit according to the invention includes latch means for generating a latch signal for switching operations, and input selector means having selector control means for selecting either one-bit data or series data in response to the supply of operation switching signal and operation switching latch signal. Block tests thus can be executed with an interval corresponding to two clock pulses immediately after the switching of operations from the scan test operation. It is thus possible to execute the real time cycle tests easily and reliably by making the interval corresponding to two clock pulses in the delay measurement using the scan path and the block test operation to be coincident with the clock cycle of the device under test. Parts that should be rejected can be removed in the stage of parts before they are mounted in the device for testing.

BRIEF DESCRIPTION OF THE DRAWINGS

The above and other objects, features and advantages of the present invention will be apparent from the following description of preferred embodiments of the invention explained with reference to the accompanying drawings, in which.

PREFERRED EMBODIMENTS OF THE INVENTION

Now, preferred embodiments of the invention are explained with reference to the drawings.

Figure 1A:
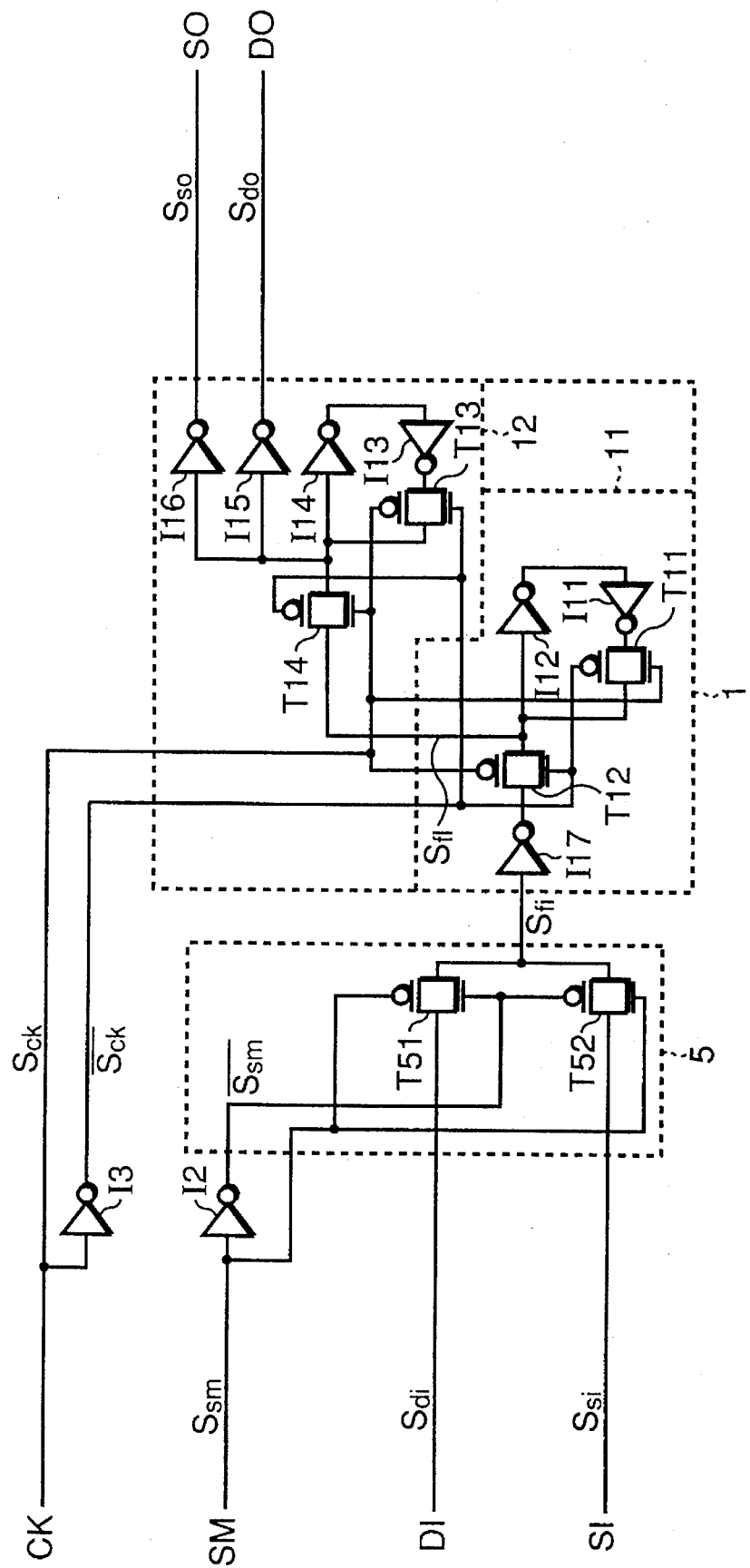
FIG. 1A is a circuit diagram showing a first example of prior art scan test circuit.
Figure 2:
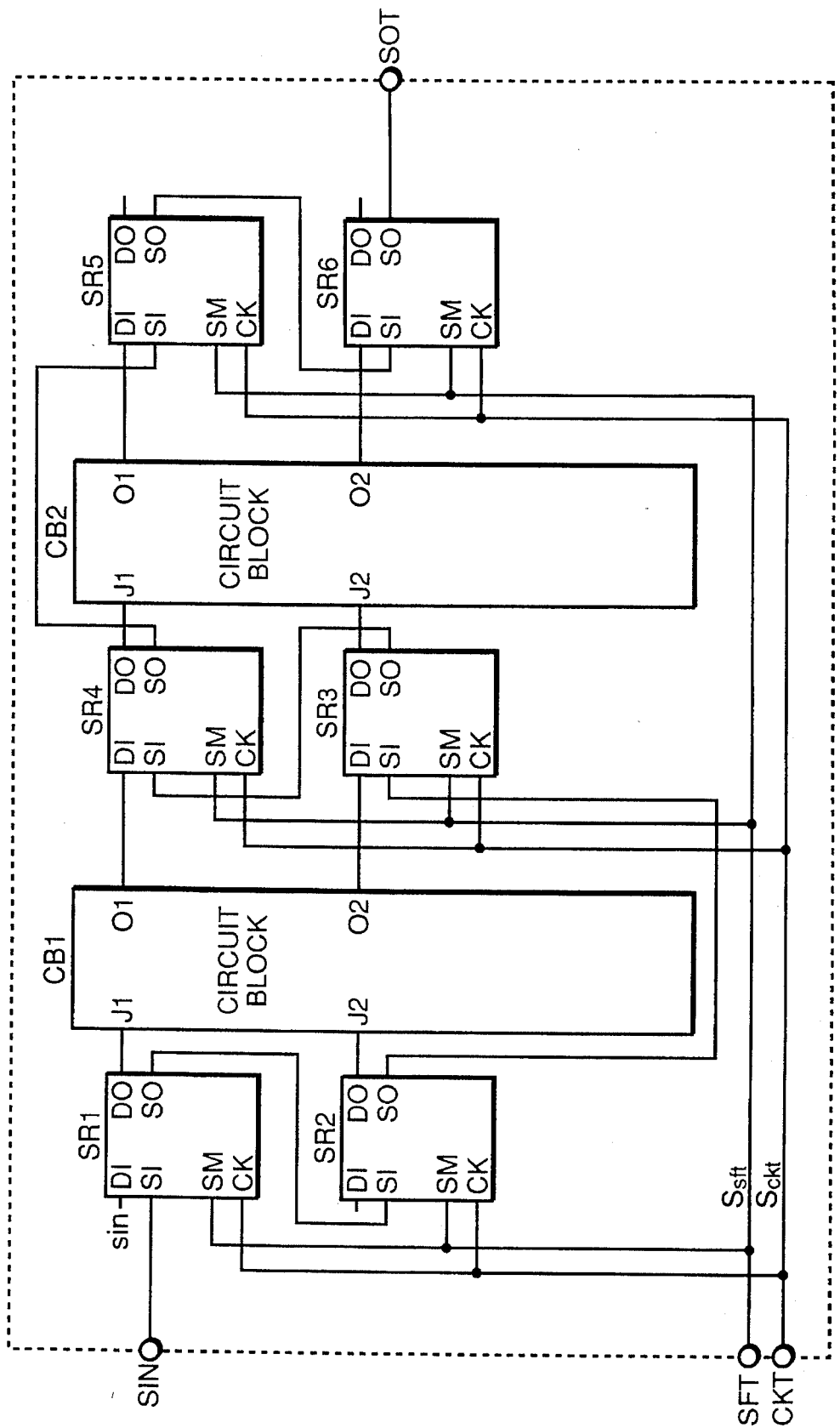
FIG. 2 is a block diagram of a prior art semiconductor integrated circuit utilizing the prior art scan test circuit shown in FIG. 1.
Figure 3:
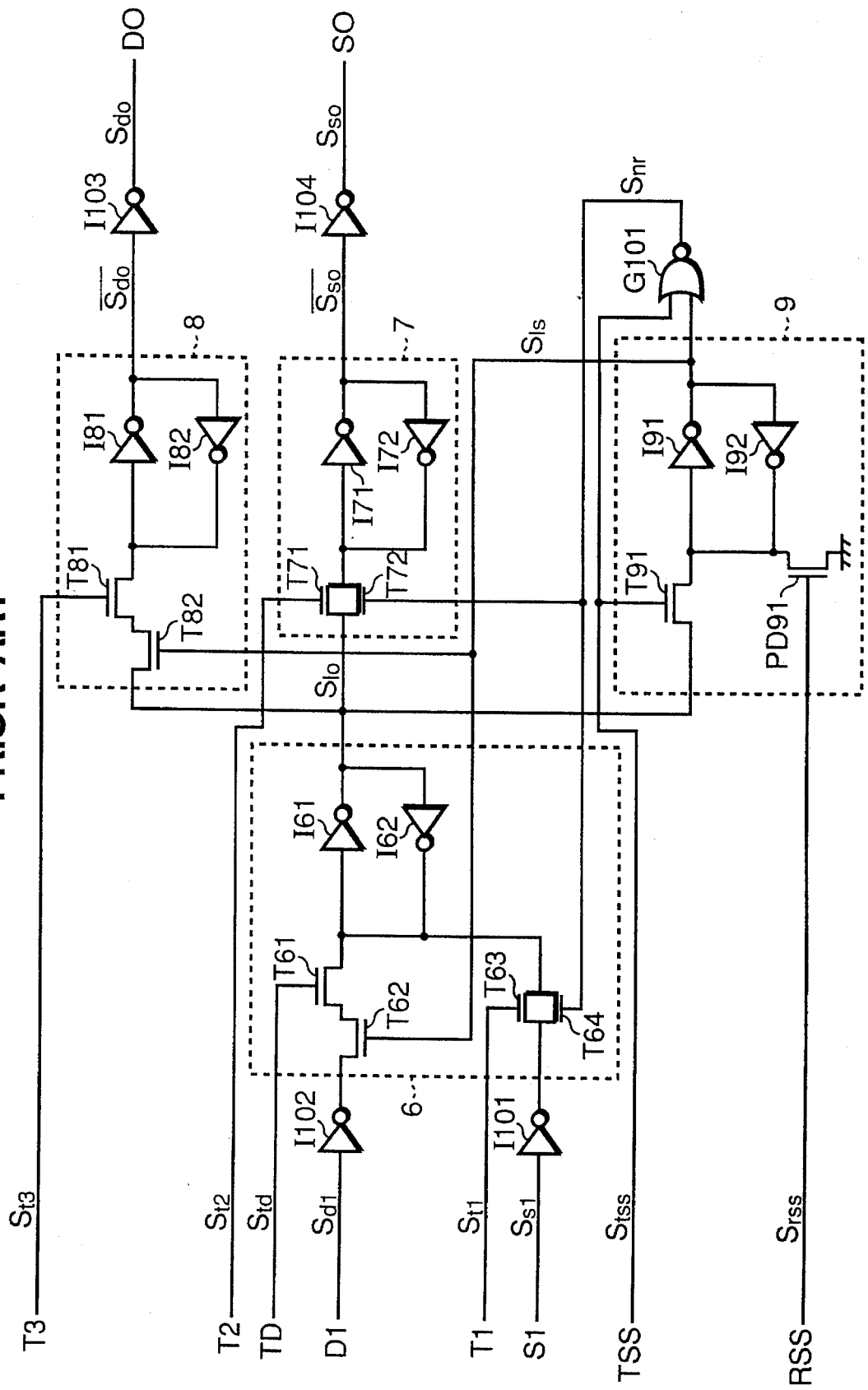
FIG. 3 is a circuit diagram showing a second example of prior art scan test circuit.
Figure 4:
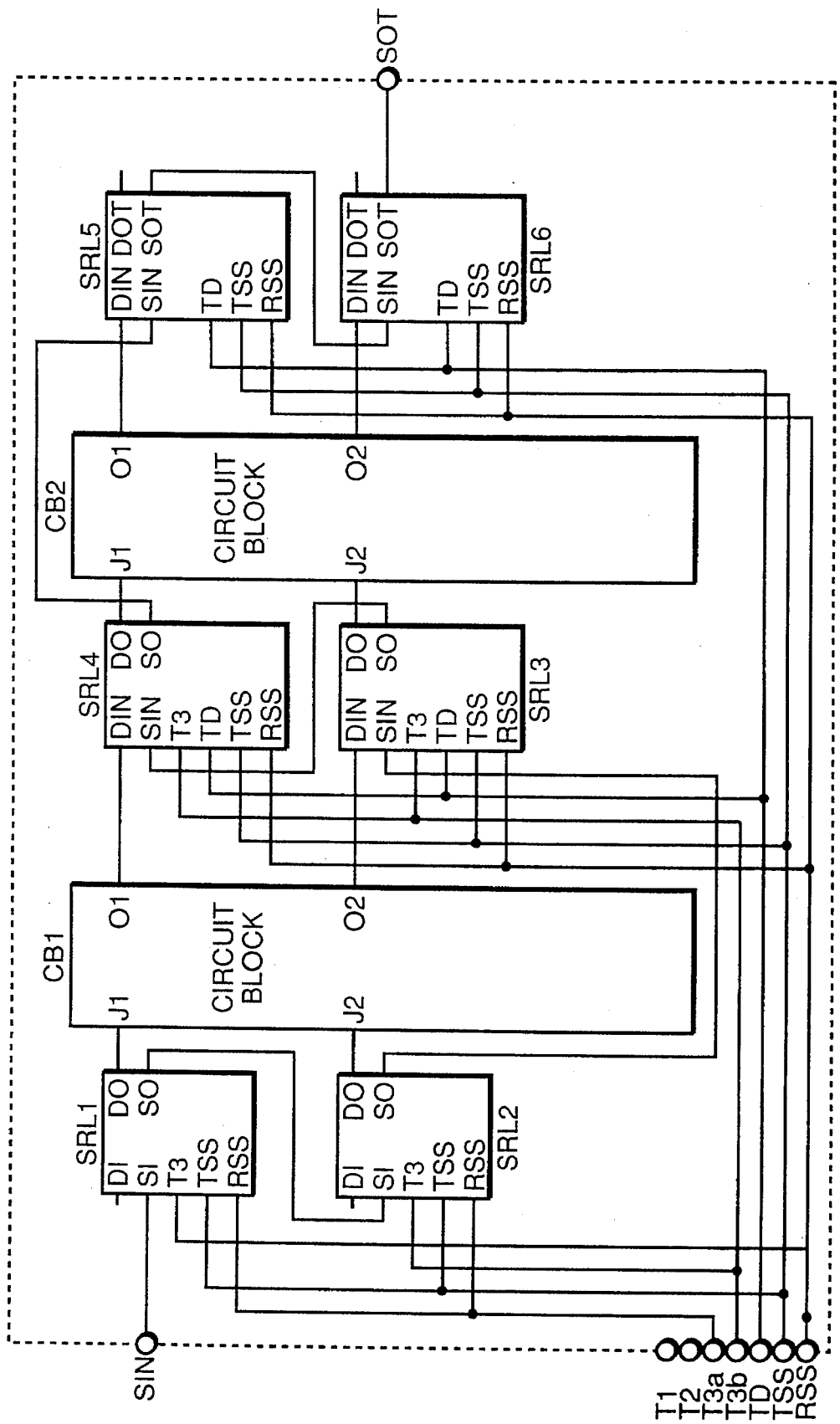
FIG. 4 is a block diagram of a prior art semiconductor integrated circuit utilizing the prior art scan test circuit shown in FIG. 3.
Figure 5:
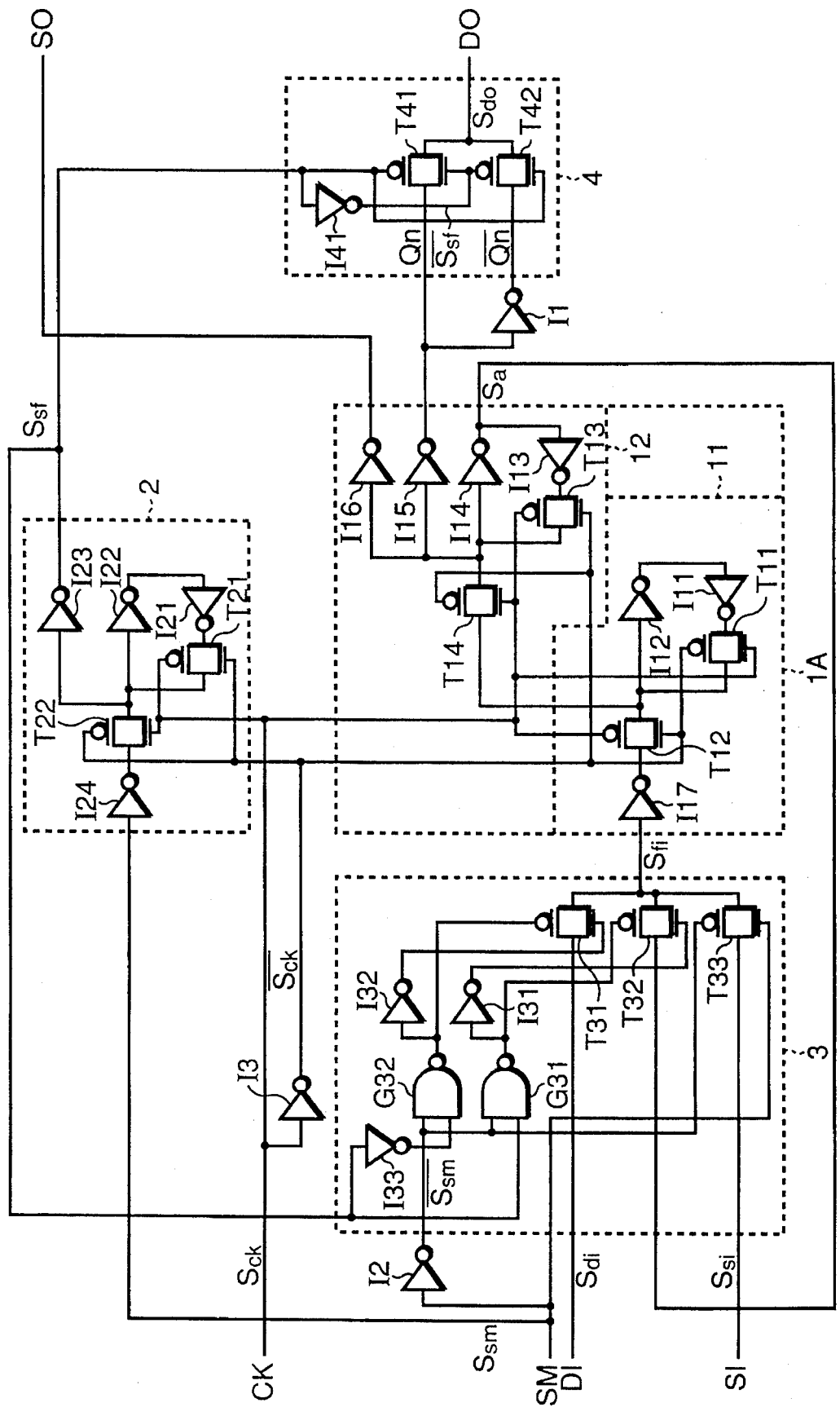
FIG. 5 is a circuit diagram showing a scan test circuit as a first embodiment according to the invention.

FIG. 5 shows, in a circuit diagram, a scan test circuit of a first embodiment according to the invention. In FIG. 5, constituent elements like those in FIG. 1 are designated by like reference numerals and symbols. The scan test circuit illustrated comprises a flip-flop 1A which is the same as the prior art one except that a signal $S_a$ of the same polarity as the output signal Qn is outputted from the output terminal of the inverter I14, a latch 2 operable in response to the supply of the clock $S_{ck}$, a selector 3 for generating a signal $S_{fi}$ supplied to the flip-flop 1A by selecting the signal $S_a$, a one-bit data input signal $S_{di}$ and a serial data signal $S_{si}$ according to a shift mode signal $S_{sm}$ and an output $S_{sf}$ of the latch 2, an inverter I1 for generating an inverted signal Qn-bar obtained from the signal Qn, an inverter I2 for generating an inverted signal $S_{sm}$-bar obtained from the signal $S_{sm}$, and a selector 4 for providing a register output $S_{do}$ by selecting the signal Qn and its inverted signal Qn-bar according to the signal $S_{sf}$.

The latch 2 includes inverters I21 to I24 and CMOS transfer gates T21 and T22. A signal $S_{sm}$ is inputted to the input terminal of the inverter I24, which has the output terminal connected to the input terminal of the transfer gate T22. The transfer gate T22 has its output terminal connected to the input terminal of the inverter I22 and the output terminal of the transfer gate T21. The inverter I22 has the output terminal connected to the input terminal of the inverter I21, which has its output terminal connected to the input terminal of the transfer gate T21. A clock $S_{ck}$ is supplied to the an N-channel gate of the transfer gate T21 and the P-channel gate of the transfer gate T22, and an inverted clock $S_{ck}$-bar is supplied to the P-channel gate of the transfer gate T21 and the N-channel gate of the transfer gate T22.

The selector 3 includes inverters I31 to I33, CMOS transfer gates T31 to T33 with the output terminals connected commonly to output a signal $S_{fi}$, and NAND gates G31 and G33. The NAND gate G32 outputs a NAND signal between the inverted signal $S_{sm}$-bar from the inverter I2 inverting the signal $S_{sm}$ and the inverted signal from the inverter I33 inverting the signal $S_{sf}$. The inverter I32 inverts the NAND signal from the NAND gate G32 to produce an inverted NAND signal. These NAND and inverted NAND signals are supplied to the transfer gate T31 so as to on-off control of the input signal $S_{di}$ at the transfer gate T31. Likewise, the NAND gate G31 outputs a NAND signal between the inverted signal $S_{sm}$-bar from the inverter I2 inverting the signal $S_{sm}$ and the signal $S_{sf}$. The inverter I31 inverts the NAND signal from the NAND gate G31 to produce an inverted NAND signal. These NAND and inverted NAND signals are supplied to the transfer gate T32 so as to on-off control of the input signal $S_a$ at the transfer gate T32. The transfer gate T33 on-off controls the input signal $S_{si}$ to the transfer gate T33 in response to the supply of the signal $S_{sm}$ and its inverted signal $S_{sm}$-bar to the N-channel and P-channel gates.

The selector 4 includes an inverter I41 for inverting the signal $S_{sf}$ to generate an inverted signal $S_{sf}$-bar and CMOS transfer gates T41 and T42, which receive the output data signal Qn of the flip-flop 1A and the inverted output data signal Qn-bar at their input terminals controlled by the signal $S_{sf}$ and the inverted signal $S_{sf}$-bar and have their output terminals connected together to output an output signal $S_{do}$.

TABLE 1

| State | $S_{sm}$ | $S_{sf}$ | $S_{din}$ | $S_{sin}$ | $S_{ck}$ | Qn | $S_{do}$ |
|---|---|---|---|---|---|---|---|
| 1 | 0 | 0 | $S_{di}$ | * | ↑ | $S_{di}$ | Qn |
| 2 | 1 | 0 | * | $S_{si}$ | ↑ | $S_{si}$ | Qn |
| 3 | 1 | 1 | * | $S_{si}$ | ↑ | $S_{si}$ | Qn-bar |
| 4 | 0 | 1 | * | * | ↑ | HOLD | Qn |

The operation of this embodiment will now be described with reference to FIG. 5 and also to Table 1 showing truth values of the individual signals. The operation of the circuit can be in one of four, i.e., first to fourth, states, as shown in Table 1, in dependence on the values of the shift mode signal $S_{sm}$ and the output signal $S_{sf}$ of the latch 2. The value of the output signal $S_{sf}$ of the latch 2, which receives the shift mode signal $S_{sm}$, is changed in synchronization with the clock $S_{ck}$. The second and fourth states thus prevail only in one cycle immediately after a change in the signal $S_{sm}$. More specifically, the second state prevails only in one cycle immediately after the inversion of the signal $S_{sm}$ from "0" to "1", i.e., from "L" level to "H" level, and the fourth state conversely prevails only one cycle immediately after the inversion of the signal $S_{sm}$ from "1" to "0", i.e., from "H" lever to "L" level.

The operation in the individual states will now be described. The first state is brought about when the signals $S_{sm}$ and $S_{sf}$ both become "0". In this case, the NAND gates G31 and G32 in the selector 3 provides the "H" and "L" level outputs, respectively. The transfer gates T31, T32 and T33 thus turn to "on", "off" and "off" states, respectively. The output signal $S_{di}$ is thus selected as the output signal $S_{fi}$ to the flip-flop 1A. In the selector 4, the transfer gates T41 and T42 thus turn to "on" and "off" states, respectively. The output signal Qn of the flip-flop 1A is thus selected as the output $S_{do}$ of the circuit.

The second state is brought about when the signals $S_{sm}$ and $S_{sf}$ are "1" and "0", respectively. In this case, the NAND gates G31 and G32 in the selector 3 both provide the "H" level outputs. The transfer gates T31 and T32 thus turn to the "off" state, while the transfer gate T33 turns to the "on" state. The serial input signal $S_{si}$ is thus selected to be outputted as the signal $S_{fi}$ to the flip-flop 1A. The selector 4, which is controlled by the sole signal $S_{sf}$, is thus in the same state as in the case of the first state, thus selecting the signal Qn as the output $S_{do}$ of the circuit.

The third state is brought about when both the signals $S_{sm}$ and $S_{sf}$ become "1". In this case, the NAND gates G31 and G32 in the selector 3 both provide the "H" level output signals. The transfer gates T31 and T32 thus turn to the "off" state, while the transfer gate T33 becomes the "on" state. The serial input signal $S_{si}$ is thus selected to be outputted as the signal $S_{fi}$ to the flip-flop 1A. In the selector 4, the transfer gates T41 and T42 thus turn to the "off" and "on" states, respectively. The inverted signal Qn-bar is thus selected as the output $S_{do}$ of the circuit.

Finally, the fourth state is brought about when the signals $S_{sm}$ and $S_{sf}$ become "0" and "1", respectively. In this case, the NAND gates G31 and G32 in the selector 3 provide the "L" and "H" level outputs, respectively. The transfer gates T31 AND T33 turn to the "off" state, while the transfer gate T32 becomes the "on" state, respectively. The signal $S_a$ corresponding to the output signal Qn of the flip-flop 1A is thus selected as the signal $S_{fi}$ to be outputted to the flip-flop 1A. As in the third state, the transfer gates T41 and T42 turn to the "off" and "on" states, respectively. The inverted signal Qn-bar is thus selected as the output $S_{do}$ of the circuit.

In either of the first to fourth states, the hold signal Qn of the flip-flop 1A is provided as the output signal $S_{so}$ to the output terminal SO.

Figure 6:
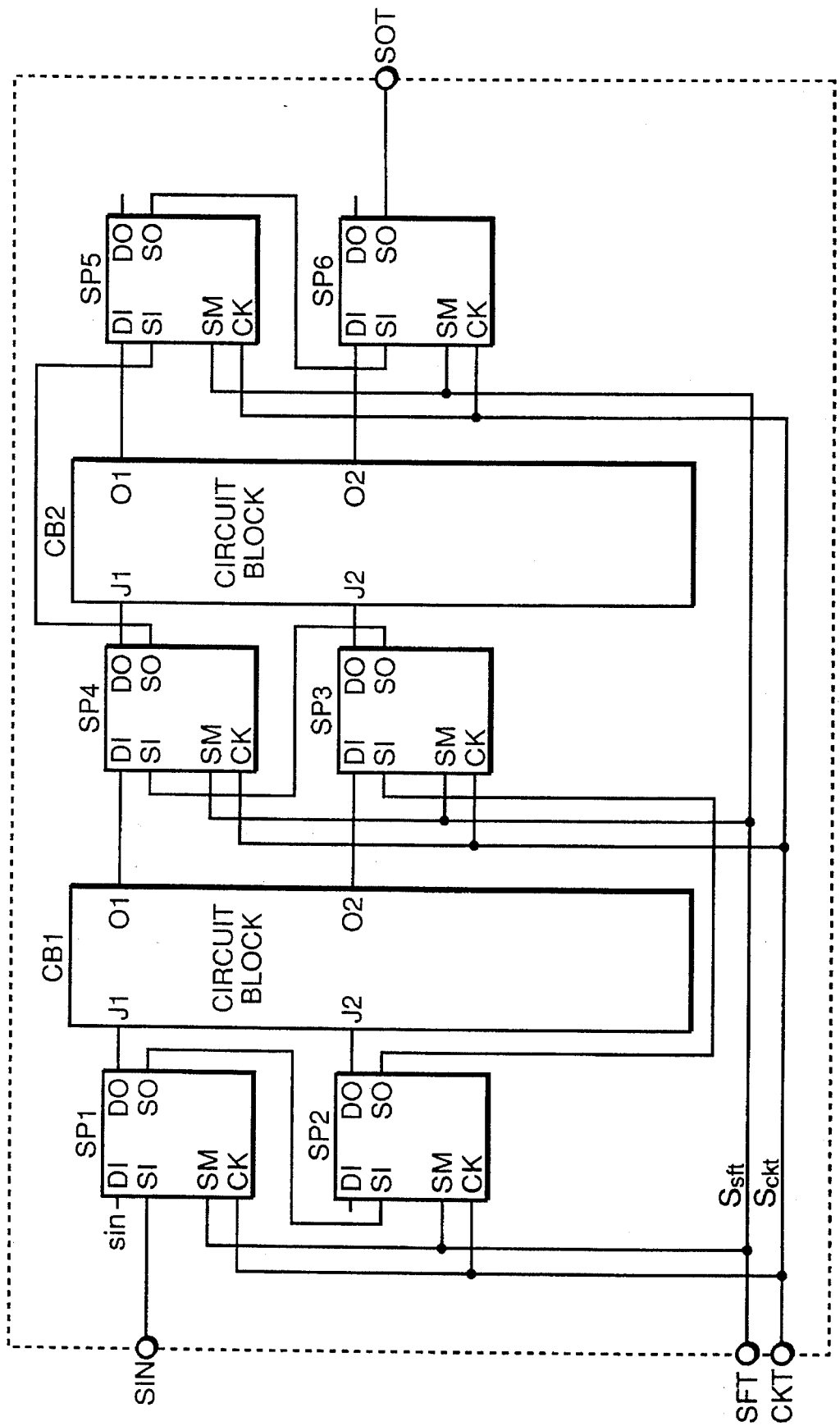
FIG. 6 is a block diagram of a semiconductor integrated circuit utilizing a scan test circuit as a second embodiment according to the invention.

FIG. 6 is a block diagram showing a semiconductor integrated circuit device chip (hereinafter referred to as "chip") as a second embodiment of the invention, which uses the scan test circuit in the first embodiment as the shift registers SP1 to SP6 and comprises two under-test circuit blocks CB1 and CB2 as in the prior art. The operation of the semiconductor integrated circuit device in this embodiment will now be described with reference to FIG. 6 and also to FIG. 7 which is a time chart showing various signal waveforms. In normal operation, the shift mode signal $S_{sft}$ of the chip, i.e., the shift mode signal supplied to the scan test circuits SP1 to SP6, is held at "L" level. The scan test circuits SP1 to SP6 thus execute the same operation as done by the single flip-flop by holding the first state in response to the supply of the signal $S_{sm}$. Specifically, in response to the clock $S_{ckt}$ of the chip, the scan test circuits SP1 to SP6 take-in the input data $S_{di}$ at the terminal D1 and provide the output data $S_{do}$ to the terminal DO. The chip thus forms a synchronous chip such that the outputs $S_{do}$ of the scan test circuits SP1 and SP2 are supplied to the input terminals J1 and J2 of the circuit block CB1, the outputs o2 and o1 of the circuit block CB1 are supplied as the signal $S_{di}$ to the input terminals DI of the scan test circuits SP3 and SP4, and the outputs $S_{do}$ of the scan test circuits SP3 and SP4 are supplied to the input terminals J2 and J1 of the circuit block CB2.

Test operation, as in the prior art, is executed as scan operation and block test operation. The scan operation is executed as scan-in and scan-out operations. The scan-in operation and the scan-out operation are executed simultaneously.

In the scan operation, the shift mode signal $S_{sft}$ is set to "H" level. AS a result, the scan test circuits SP1 to SP6 are set to the second or third states. An operation as flip-flop is thus caused such that the serial signal $S_{sin}$ is selected as input, the serial data $S_{si}$ inputted to the input terminal SI in synchronization with the clock $S_{ck}$ is taken-in, and the signal $S_{so}$ is provided to the terminal SO. In the scan-in operation, test data in the circuit blocks CB1 and CB2 are taken-in from the serial data input terminal SIN of the chip. The scan-out operation is simultaneously executed such that output data of the circuit blocks CB1 and CB2 having been taken-in into the test circuit are provided to the serial data output terminal SOT of the chip.

The block test operation is executed for a period of time corresponding to two cycles immediately after the scan operation. In this case, the shift mode signal $S_{sft}$ which has been set to "H" level in the scan operation, is set to "L" level. This has an effect of holding the scan test circuits SP1 to SP6 in the fourth state in the first cycle immediately after the scan operation and in the first state in the next cycle. In the first cycle, the content in the scan test circuit is not changed under control of the clock $S_{ck}$, and only inversion of the output from the inverted signal Qn-bar to the signal Qn takes place. It is only when this signal change occurs that the desired test pattern is supplied to the circuit blocks CB1 and CB2. In the next cycle, the scan test circuits SP1 to SP6 are held in the fourth state, i.e., the same state as in the normal operation, and the circuit blocks CB1 and CB2 provide test result corresponding to the test pattern provided in the preceding cycle. This test result is taken-in into the scan test circuits SP1 to SP6 in response to the supply of one pulse of the clock $S_{ck}$. Subsequently, desired result can be provided by executing the scan-out operation. The delay in the circuit block CB1 or CB2 can be measured from the time interval between pulses of the clock $S_{ck}$ corresponding to the two cycles in the clock operation (hereinafter referred to as "clock pulse interval"). If the clock pulse interval is too short, the second clock pulse is supplied before the test result corresponding to the test pattern given by the first clock pulse is outputted. In this case, the scan test circuits SP3 to SP6 cannot take-in the correct test result, but rejected test results is provided. The delay time in the circuit block CB1 or CB2 can be determined by finding out the clock pulse intervals corresponding to rejected and passed test results. The scan operation and block test operation are executed alternately for each pattern. In this way, operations with respect to all the required test patterns are executed to complete the test on the circuit blocks CB1 and CB2.

Figure 8:
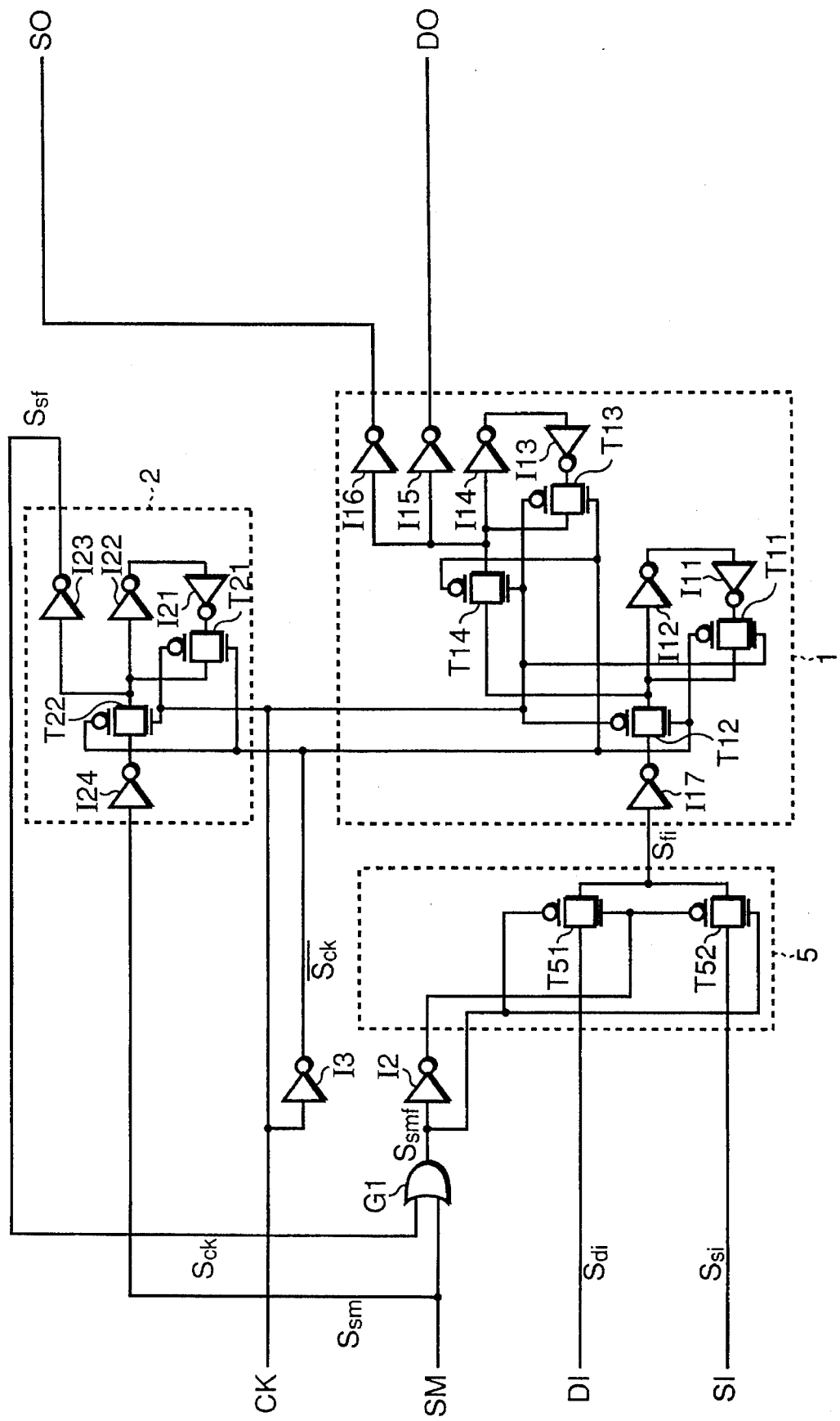
FIG. 8 is a circuit diagram showing a scan test circuit as a third embodiment according to the invention.

FIG. 8 shows a third embodiment of the invention. In the Figure, elements like those in FIGS. 5 and 6 are designated by like reference numerals and symbols. The scan test circuit in this embodiment is different from the previous first embodiment in that a selector 5 which is like the first mentioned prior art scan test circuit and an OR gate G1 for taking OR of the shift mode signal $S_{sm}$ and the signal $S_{sf}$ and outputting the signal $S_{smf}$ as a control signal to the selector 5, are provided in lieu of the selectors 3 and 4.

TABLE 2

| State | $S_{sm}$ | $S_{sf}$ | $S_{din}$ | $S_{sin}$ | $S_{ck}$ | Qn | $S_{do}$ |
|---|---|---|---|---|---|---|---|
| 1 | 0 | 0 | $S_{di}$ | * | ↑ | $S_{di}$ | Qn |
| 2 | 1 | 0 | * | $S_{si}$ | ↑ | $S_{si}$ | Qn |
| 3 | 1 | 1 | * | $S_{si}$ | ↑ | $S_{si}$ | Qn |
| 4 | 0 | 1 | * | * | ↑ | $S_{si}$ | Qn |

The operation of this embodiment will now be described with reference to FIG. 8 and also to Table 2 which is a truth table. As in the first embodiment, four, i.e., first to fourth, states are realized in correspondence to the values of the shift mode signal $S_{sm}$ and the output signal $S_{sf}$ of the latch 2.

When the first state is brought about, that is, when the signals $S_{sm}$ and $S_{sf}$ both become "0", the OR gate G1 provides output at "L" level. Thus, in the selector 5 the transfer gate T51 turns to the "on" state, while the transfer gate T52 turns to the "off" state. The input signal $S_{di}$ is thus selected as the signal $S_{fi}$ which is outputted to the flip-flop 1.

When the states other than the first state, i.e., the second to fourth states are brought about, the signals $S_{sm}$ and $S_{sf}$ become "1" and "0", "1" and "1" or "0" and "1", respectively. the output o the OR gate G1 becomes the "L" level, the transfer gate T51 in the selector 5 turns to the "off" state, and the transfer gate T52 therein turns to the "on" state. The serial signal $S_{si}$ is thus selected, so that the content Qn held in the flip-flop 1 is outputted.

Figure 9:
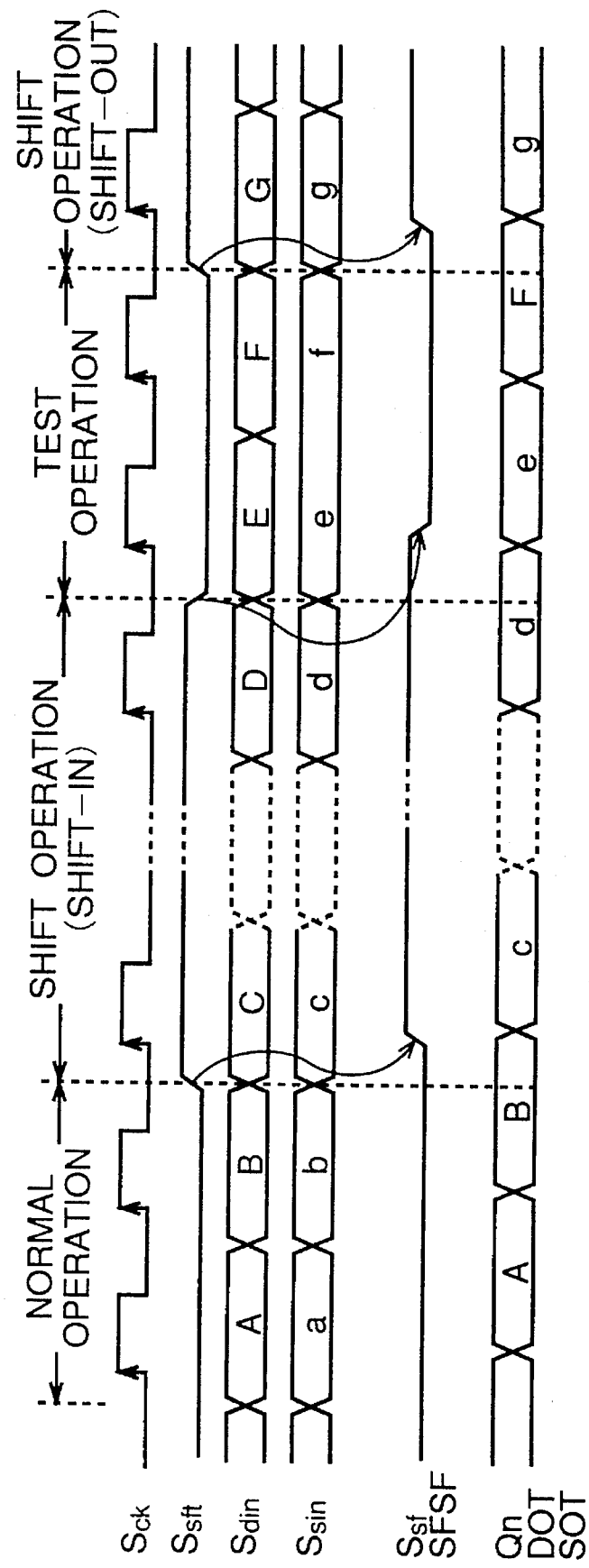
FIG. 9 is a timing chart for showing an example of signal waveforms produced in the operation of a circuit according to the invention.

The operation in the case of using the scan test circuit in this embodiment as the shift registers SP1 to SP6 shown in FIG. 9 will now be described with reference to the time chart of FIG. 9 showing operational waveforms. The normal operation is entirely the same as in the first embodiment. The test operation is different from that in the previous second embodiment in that, in the block test operation, the test is done for one bit under control of the clock $S_{ck}$ in the first cycle immediately after the scan operation, that this scan causes change of the content in the scan test circuit and the output thereof from signal Qn-1 to signal Qn and that the scan-in operation is done with respect to test patterns of scan test circuits up to one preceding the circuit under test.

In the scan test circuit in the above first or third embodiment, it may be impossible to measure the delay time in dependence on the logic of the under-test circuit block. For example, in the scan test circuit in the first embodiment, with exclusive OR logic of the under-test circuit block, an even input bit number causes a change of inverted signal to a positive signal, and the output is not changed. In the scan test circuit in the second embodiment, with AND OR logic of the under-test circuit block and when the path corresponding to the test circuit to be scanned subsequently is the critical path, either an output change in the path corresponding to the test circuit to be scanned subsequently takes place earlier, or the test result is not changed with that in the preceding cycle. For this reason, the delay measurement in the clock pulse internal results in a value shorter than the actual value, or rejected state is provided continuously, thus making the measurement impossible.

Figure 7:
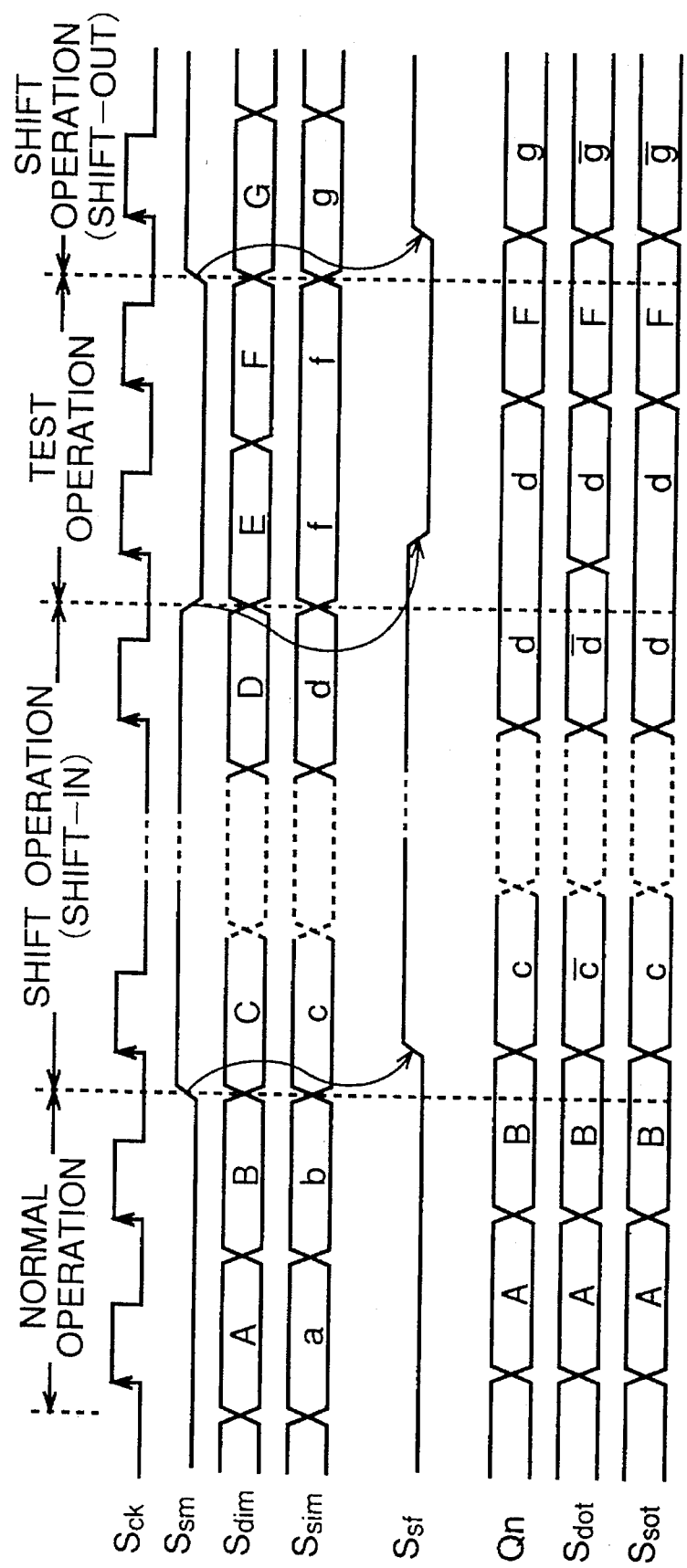
FIG. 7 is a timing chart for showing an example of signal waveforms produced in the operation of a circuit according to the invention.
Figure 10:
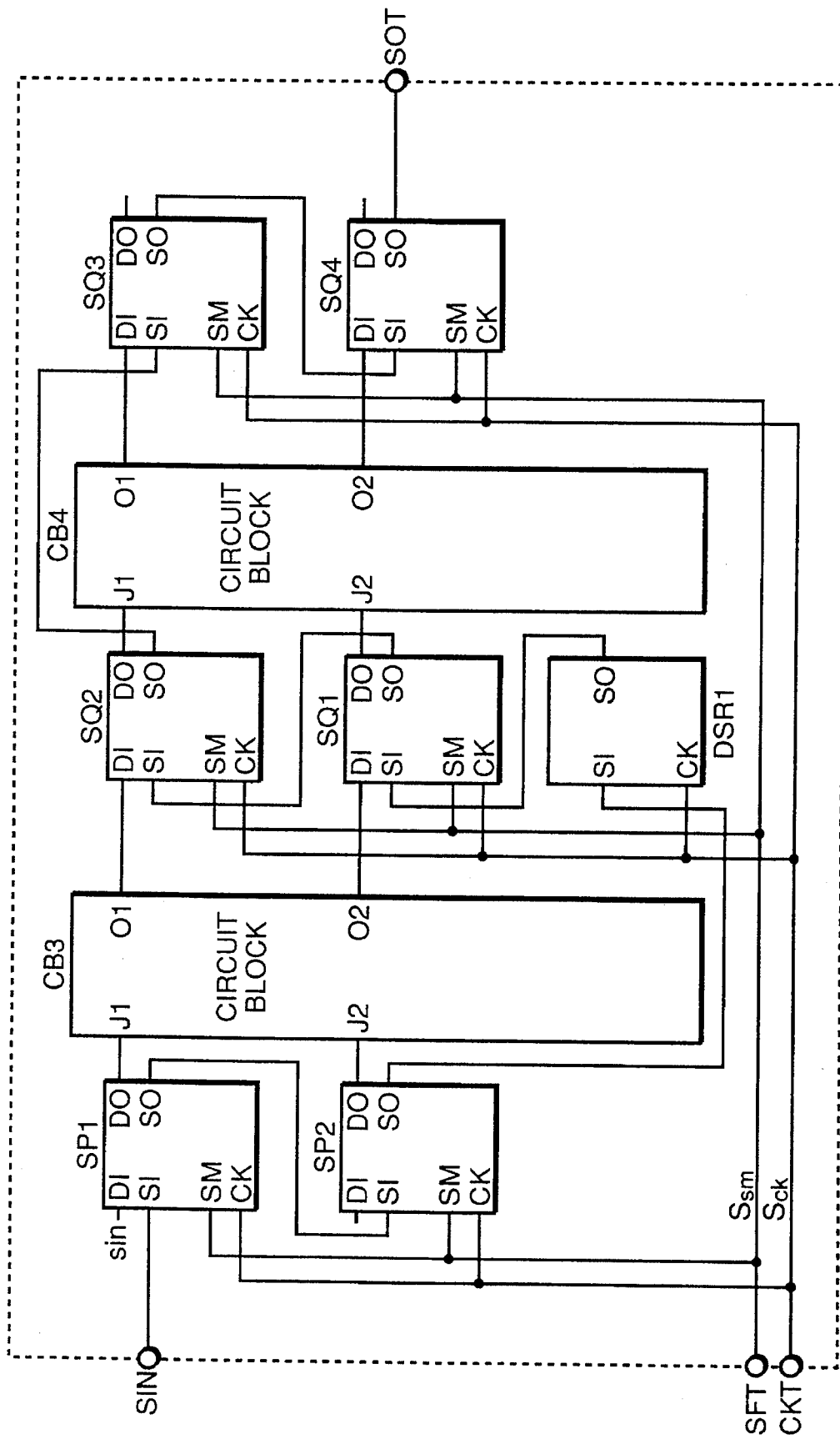
FIG. 10 is a circuit diagram showing a semiconductor integrated device utilizing a scan test circuit as a fourth embodiment according to the invention.

FIG. 10 is a block diagram showing a semiconductor integrated circuit device (chip) as a fourth embodiment of the invention, which uses the scan test circuits in the first and second embodiments in dependence on the logic of under-test circuit block as a measure to overcome the drawback discussed above. In the Figure, elements like those shown in FIG. 7 are designated by like reference numerals and symbols. This embodiment of the chip comprises a circuit block CB3, in which the under-test logic circuit is constituted by an AND gate that is incapable of testing with the third embodiment circuit and the path from the input terminal J2 is a critical path, a circuit block CB4, in which the under-test logic circuit is constituted by an exclusive OR gate that is incapable of testing with the first embodiment circuit, first embodiment scan test circuits SP1 and SP2 for testing the circuit block CB3, third embedment scan test circuits SQ1 to SQ6 for testing the circuit block CB4, and a dummy shift register DS2.

The dummy shift register DSR1 is disposed before the shift register group constituted by the third embodiment scan test circuits SQ1 to SQ4 on the scan path. They take-in the serial data $S_{si}$ supplied to the input terminal SI to output the data to the output terminal SO in synchronization with the clock $S_{ck}$.

In this embodiment, the scan test circuits for inputting test signal thereto are classified in dependence on the logic of the under-test circuit, but the disposition of the dummy test register before the group of the third embodiment scan test circuits on the scan path, permits coexistence of different types of scan test circuits.

While the invention has been described in its preferred embodiments, it is to be understood that the words which have been used are words of description rather than limitation and that changes within the purview of the appended claims may be made without departing from the true scope of the invention as defined by the claims.

What is claimed is:

1. In a scan test circuit having a first input terminal for inputting first data of one bit, a second input terminal for inputting second data as serial data including predetermined scan test data, a third input terminal for inputting an operation switching signal for determining a scan operation and a normal operation, an input selector means for selecting one of said first data and said second data in response to the supply of said operation switching signal and outputting selected data, a register means for holding said selected data as hold data, a first output terminal for outputting first output data corresponding to said first data, and a second output terminal for outputting second output data corresponding to said second data, said scan test circuit being operable to carry out scanning operation such that, during normal operation, a plurality of under-test circuits are caused to be operated independently with one another and, during test operation, said plurality of under-test circuits are connected in series and said second data are supplied to a first-stage under-test circuit of said plurality of under-test circuits, and test results corresponding to said second data are outputted from a last-stage under-test circuit of said plurality of under-test circuits, the improvement comprising:

a latch means which latches said operation switching signal and generates an operation switching latch signal; and a selector control means which is provided in said input selector means and which selects one of said first data and said second data in response to the supply of said operation switching signal and said operation switching latch signal and outputs the selected data.

2. A scan test circuit according to claim 1, which further comprises output selector means for selectively outputting, as said first output data, one of a signal of said hold data and a signal inverted therefrom in response to the supply of said operation switching latch signal, said selector control means including:

a first control signal generator for generating first to fourth control signals corresponding to first to fourth control modes in response to the combination of respective operation switching signals and respective values of the operation switching latch signals; and first to third switch circuits for selecting one of said first data, said second data and said hold data in response to the supply of said first to fourth control signals and outputting said selected data.

3. A scan test circuit according to claim 1, in which said selector control means includes:

a second control signal generator for generating a fifth control signal corresponding to a fifth control mode and a sixth control signal corresponding to a sixth control mode other than said fifth control mode in response to the combination of respective operation switching signals and respective values of the operation switching latch signals; and a fifth and a sixth switch circuit for selecting one of said first and second data in response to the supply of each of said fifth ant sixth control signals and outputting the selected data.

4. A semiconductor integrated circuit device comprising at least three of the scan test circuit as claimed in claim 1, and at least two blocks of said under-test circuits having their input and output terminals connected to respective terminals of said scan test circuits.

5. A semiconductor integrated circuit device comprising at least three of the scan test circuit as claimed in claim 1, and at least two blocks of under-test circuits having their input and output terminals connected to respective terminals of said scan test circuits.

6. A semiconductor integrated circuit device comprising the scan test circuit as claimed in claim 1, and at least two blocks of said under-test circuits having their input and output terminals connected to respective terminals of said scan test circuit.

7. A semiconductor integrated circuit device according to claim 6, which further comprises a dummy register which receives an output data from said scan test circuit and generates an input signal of a latter stage of said under-test circuits.

* * * * *

UNITED STATES PATENT AND TRADEMARK OFFICE
CERTIFICATE OF CORRECTION

PATENT NO. : 5,617,428
DATED : April 1, 1997
INVENTOR(S) : Yasuhiro Andoh

It is certified that error appears in the above-indentified patent and that said Letters Patent is hereby corrected as shown below:

Claim 3, Column 14, Line 13, "ant" should be --and--.

Signed and Sealed this

Twenty-fourth Day of June, 1997

Attest:

BRUCE LEHMAN

*Attesting Officer*   *Commissioner of Patents and Trademarks*